United States Patent [19]

Kaatz

[11] Patent Number: 4,764,737
[45] Date of Patent: Aug. 16, 1988

[54] FREQUENCY SYNTHESIZER HAVING DIGITAL PHASE DETECTOR WITH OPTIMAL STEERING AND LEVEL-TYPE LOCK INDICATION

[75] Inventor: Gary F. Kaatz, Hoffman Estates, Ill.

[73] Assignee: Motorola, Inc., Schaumburg, Ill.

[21] Appl. No.: 123,415

[22] Filed: Nov. 20, 1987

[51] Int. Cl.$^4$ .......................... H03L 7/06; H03D 3/02; H03K 9/06

[52] U.S. Cl. ................................... 331/1 A; 331/10; 331/DIG. 2; 307/511; 307/514; 307/516; 307/527; 328/133; 328/134

[58] Field of Search ............ 331/1 A, 10, 25, DIG. 2; 307/510, 511, 514, 516, 519, 525, 526, 527, 528; 328/133, 134, 155

[56] References Cited

U.S. PATENT DOCUMENTS 4,122,405 10/1978 Tietz et al. ............... 331/DIG. 2 X

OTHER PUBLICATIONS

"A Three State Phase Detector Can Improve Your Next PPL Design", by C. A. Sharpe, EDN, Sep. 20, 1976.

"Speed-Up PLLS in Digital Synthesizers", *Electronic Design*, Nov. 22, 1977, by C. A. Sharpe.

Motorola Publication No. 68P81020E09-0.

*Primary Examiner*—Eugene R. LaRoche
*Assistant Examiner*—David Mis
*Attorney, Agent, or Firm*—Robert J. Crawford

[57] ABSTRACT

For use in a radio synthesizer (110), a digital phase detector (118) indicates the phase error between a reference signal provided by a reference oscillator (117) and an output frequency signal (114) provided by a voltage controlled oscillator (112). The digital phase detector (118) includes four flip/flops (310, 312, 314 and 316) which receive the frequency signals (116 and 120) provided by the oscillators (117 and 112) to generate steering signals (126) which optimally indicate the phase error between the frequency signals (116 and 120) as well as providing optimal (maximum) frequency steering when a frequency difference between the frequency signals (116 and 120) exists. Responsive to the flip/flops, digital logic circuitry (306) is used to provide a non-integrated level-type indication when the frequency signals (116 and 120) are phase locked.

12 Claims, 2 Drawing Sheets

4,764,737

FREQUENCY SYNTHESIZER HAVING DIGITAL PHASE DETECTOR WITH OPTIMAL STEERING AND LEVEL-TYPE LOCK INDICATION

FIELD OF THE INVENTION

The present invention relates generally to radio frequency (RF) communication circuits, and, more particularly, to frequency synthesizers.

DESCRIPTION OF THE PRIOR ART

Frequency synthesizers employing digital (also known as three-state) phase detectors are commonly used to provide a stable signal for use by the transmitter and/or the receiver. In a typical synthesizer design, a voltage controlled oscillator (VCO) is employed to provide an output signal which is phase-locked to a reference signal. A phase detector is used to compare the reference signal with a frequency signal which is proportional to the output signal. Any difference between the signals is indicated to a correction circuit by providing error signals thereto. The correction circuit generates an error voltage which is used to correct the frequency of the VCO so that the output signal tracks the phase of the reference signal.

Ideally, the phase detector is designed to maximally steer the frequency of the VCO in such a manner that the oscillator's frequency signal will be corrected within an optimal time span. Maximum steering entails the correction circuit maintaining its maximum output level for the duration of the frequency difference.

Previous attempts at providing such a phase detector with optimal correction time have been unsuccessful. Each attempt has exhibited poor loop acquisition performance, i.e., each has failed to cause the signals to phase-lock rapidly from a start-up state. In one previous attempt, such poor performance is due to the phase detector's error outputs pulsing, for any frequency difference between the reference frequency and the frequency of the oscillator. This results in an average value of frequency steering significantly less than optimal. Consequently, degraded loop acquisition performance results.

In another previous attempt, the phase detector includes circuitry for detecting and indicating when the signals received by the phase detector differ in frequency by a ratio of 2:1 or greater. In response to this condition, the phase detector latches a steering signal to provide maximum steering to the oscillator. However, when the ratio between the two frequency signals is less than 2:1, maximum steering is not provided.

Another problem known to such previous attempts involves the quality of the phase lock indication provided by the phase detector. The lock indication is typically coupled to a logic circuit and used to inform the radio when the VCO frequency signal has stabilized. When phase locked, the phase detector's phase lock indication contains narrow pulses which must be further processed with an integration circuit to provide a level-type indication. Although a level-type indication is eventually provided, the accuracy of the indication is degraded due to the estimation function inherent to the integration circuit.

Accordingly, a phase detector is needed for use in a synthesizer which overcomes the aforementioned deficiencies.

OBJECTS OF THE PRESENT INVENTION

It is a general object of the present invention to provide a frequency synthesizer which overcomes the foregoing shortcomings.

It is a more particular object of the present invention to provide a digital phase detector which provides maximum loop acquisition performance and which provides a level-type phase-lock indicator.

BRIEF DESCRIPTION OF THE DRAWINGS

The features of the present invention which are believed to be novel are set forth with particularity in the appended claims. The invention, together with further objects and advantages thereof, may best be understood by making reference to the following description taken together with the accompanying drawings, in which reference numerals identify the elements, and wherein:

DETAILED DESCRIPTION OF THE PREFERRED EMBODIMENT

The arrangement disclosed in this specification has particular use for radio frequency synthesizers. More particularly, the arrangement disclosed herein is directed to an improved synthesizer characterized by a novel digital phase detector.

Figure 1:
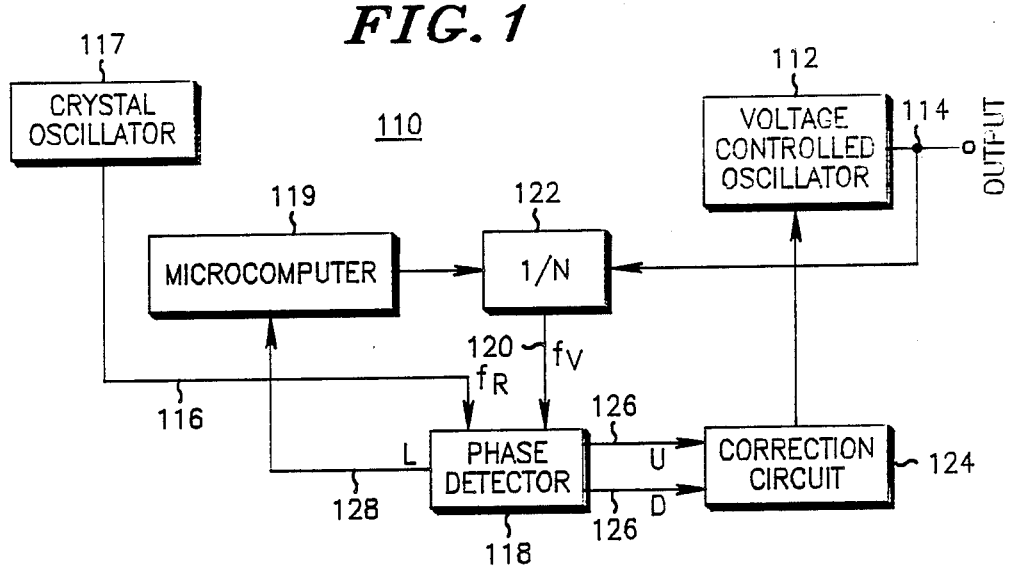
FIG. 1 is a block diagram of a radio synthesizer, according to the present invention.

FIG. 1 illustrates such an improved synthesizer 110. The synthesizer 110 employs a conventional VCO 112 to provide an output signal 114 which is phase-locked to a reference signal ($f_R$) 116 provided by a conventional crystal oscillator 117. The output signal 114 is divided down (1/N) by a programmable digital divider circuit (1/N) 122, such as an MC145158 integrated circuit available from Motorola, Inc., to provide a frequency signal ($f_V$) 120 proportional to the output signal 114. A conventional microcomputer 119 selects the divisor (N) of the divider circuit 122.

To determine any difference between the reference signal 116 and the frequency signal 120, a phase detector 118 compares the frequency and phase of the reference signal 116 with the frequency and phase of the frequency signal 120. Any difference in frequency and phase between the signals 120 and 116 is indicated to a correction circuit 124 by providing up/down steering signals 126 thereto which optimally indicate the steering direction needed.

The correction circuit 124 generates an error voltage which is used to correct (increase or decrease) the frequency of the VCO 112 so that the output signal 114 tracks the phase of the reference signal 116. The correction circuit 124 also incorporates a loop filter which determines the synthesizer's feedback loop characteristics. It may be implemented using a charge pump circuit such as the one described in the Transmitter and Receiver Logic Section of "Pulsar VHF Mobile Radio Telephone", Publication No. 68P81020E05-0, available from Motorola C & E Parts, 1313 Algonquin Rd., Schaumburg, Ill., 60196.

Not only does the phase detector 118 provide the accurate steering signals 126 to the correction circuit 124, it generates an accurate level-type phase-locked indication 128 for the microcomputer 119 to indicate when the signals 116 and 120 become phase locked. The microcomputer 119 employs the level-type phase-locked indication 128 to control radio functions such as enabling the transmitter. Unlike known phase detectors, the phase-locked indication 128 requires no further processing (integrating).

Figure 2:
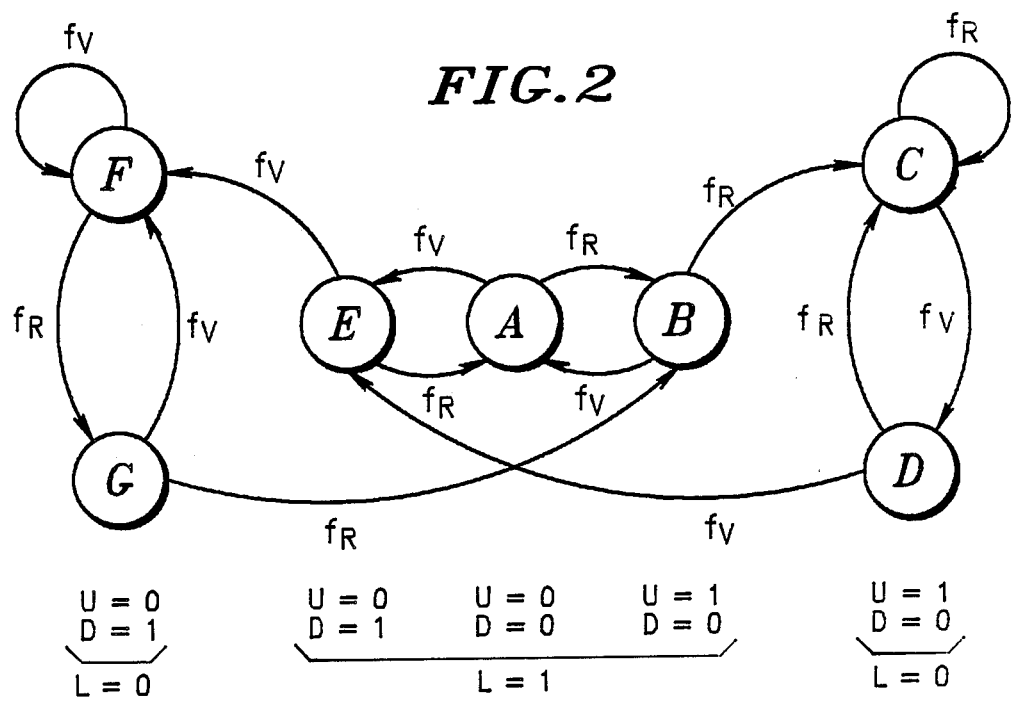
FIG. 2 is a state diagram, according to the present invention, illustrating the operation of the phase detector 118 shown in FIG. 1.
Figure 3:
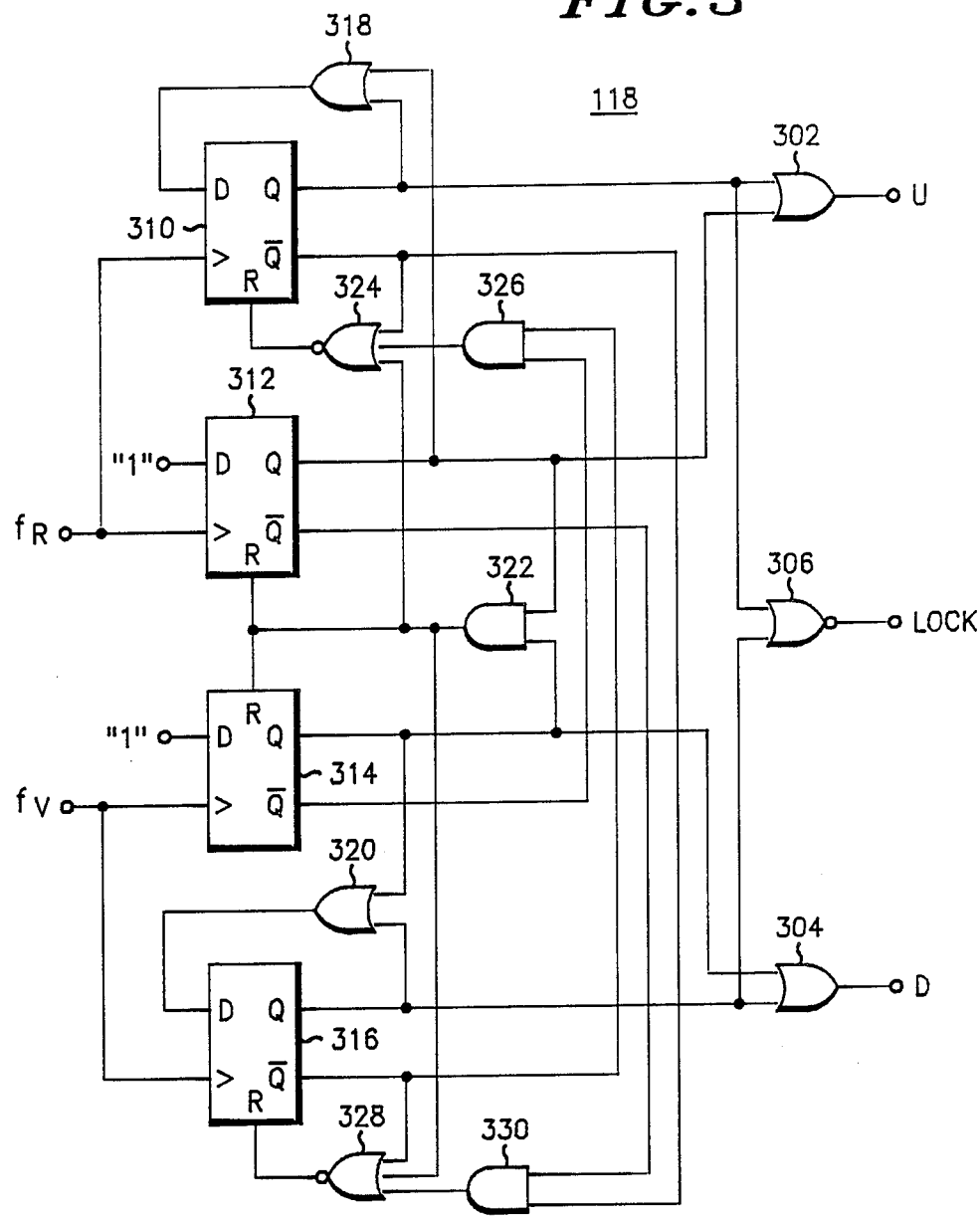
FIG. 3 is a circuit diagram of the phase detector 118 shown in FIG. 1, according to the present invention.

FIGS. 2 and 3, in accordance with the present invention, illustrate the operation of the phase detector 118. More specifically, FIG. 2 illustrates a state diagram of the phase detector circuit shown in FIG. 3.

In FIG. 2, states A, B and E correspond to the condition when the phase detector of FIG. 3 is receiving phase locked signals. States C and D correspond to the condition when the phase detector detects that the frequency of $f_R$ is greater than the frequency of $f_V$. States F and G correspond to the condition when the phase detector detects that the frequency of $f_V$ is greater than the frequency of $f_R$.

When the phase detector is in states B, C and D, it indicates that "up" (D=0, U=1) correction to the frequency of $f_V$ is needed to phase lock the signals $f_V$ and $f_R$. When the phase detector is in states E, F and G, it indicates that "down" (D=1, U=0) correction to the frequency of $f_V$ is needed to phase lock the signals $f_V$ and $f_R$. Only in state A does the phase detector indicate that correction to the frequency of $f_V$ is not necessary (D=0, U=0).

Transitions between the states occur upon the detection of an edge (positive going) of either received signal $f_R$ or $f_V$. Hereinafter, any references to an "edge" means a positive going edge or means a negative going edge depending on the logic circuitry used. The discussion that follows is provided to explain the flow between the various states.

Pressuming that the phase detector begins in state A, if the next edge that is detected is from $f_R$, a transition from state A to state B occurs. Alternatively, if the next edge that is detected is from $f_V$, a transition from state A to state E occurs. From either state B or E, if the next edge that is detected is not from the same signal as the one immediately preceding, a transition to state A occurs. Thus, so long as the detected edges are from alternating signals, $f_R$ and $f_V$, no transitions outside of states A, B and E occur, the frequencies of $f_R$ and $f_V$ are the same, and the phase detector indicates that the received signals, $f_R$ and $f_V$, are phase locked (L=1).

The phase detector indicates that the received signals, $f_R$ and $f_V$, are not phase locked (L=0) when the phase detector detects that they differ in frequency. A transition from state A to state B to state C occurs if the frequency of $f_R$ is greater than the frequency of $f_V$, and a transition from state A to state E to state F occurs if the frequency of $f_V$ is greater than the frequency of $f_R$. In this case the steering signals are maintained and not pulsed as in states A, B and E, thereby maximum steering to the correction circuit.

More particularly, from state A, such transitions to states B and C or to states E and F occur when two consecutive edges are detected from the same signal. "Consecutive" means that an intervening edge from the other signal is not detected during this period. If the consecutive edges are detected from $f_R$, flow transits from state A to state B with the first edge and from state B to state C with the second edge. If the consecutive edges are detected from $f_V$, flow transits from state A to state E with the first edge and from state E to state F with the second edge.

Once the phase detector indicates that the received signals, $f_R$ and $f_V$, are not phase locked (L=0), the phase detector continues with the L=0 indication as long as two consecutive edges from the other signal (the signal other than the one that caused the L=0 indication) are not detected. For example, once at state C, if another edge from $f_R$ is detected, the phase detector remains in state C. If an edge from $f_V$ is detected, followed by an edge from $f_R$, the phase detector transits from state C to state D and back to state C. Transporting $f_V$ with $f_R$, the same result occurs with respect to states F and G.

Once two consecutive edges from the other signal are detected, the phase detector indicates that the signals are phase locked by changing the L=0 to an L=1 indication. For example, from state C, when the signals are not phase-locked, only two consecutive edges from $f_V$ will cause the phase detector to return, via state D, to a phase-locked condition at state E initially. Likewise, from state F, only two consecutive edges from $f_R$ will cause the phase detector to return, via state G, to a phase-locked condition at state B initially. In either instance, when the phase detector returns to a phase-locked condition, by detecting two consecutive $f_V$s or $f_R$s, the phase detector will remain in the phase-locked condition until it detects two consecutive $f_R$s or $f_V$s, respectively. This allows the phase detector to correct the frequency of $f_V$ rapidly, while preventing excessive overcompensation. (Although the above operation is preferred, it should be noted that transitions could alternatively be made to from states G to E or A, or from states D to A or B.) For example, from state C, two consecutive edges from $f_V$ will cause the phase detector to transit to state E, via state D, where the phase detector indicates phase-locked signals and "down" (D=1) correction needed to $f_V$. From state E, another consecutive edge from $f_V$ will cause a transit to state F where the phase detector indicates nonphase locked signals and "up" (D=1) correction needed to $f_V$. Transposing $f_V$ with $f_R$, the same result occurs with respect to states F, G and B.

Accordingly, while the frequencies of $f_R$ and $f_V$ differ, the phase detector is in states C or D or in states F or G. The phase detector will remain in those states until the frequency of $f_V$ is corrected such that the frequencies of $f_R$ and $f_V$ differ slightly in the opposite direction, at which point state E or state B is entered to counteract the slight overcorrection of $f_V$ by pulsing the opposite error signal.

FIG. 3, in accordance with the present invention, illustrates a digital phase detector 118 which operates according to the state diagram of FIG. 2. The phase detector 118 includes four D-type flip-flops (f/fs) 310, 312, 314 and 316 which receive the signals $f_R$ and $f_V$, and three gates 302, 304 and 306 for indicating the phase/frequency relation between $f_R$ and $f_V$. Gate 302 indicates when the frequency of $f_V$ should be increased (U), gate 304 indicates when the frequency of $f_V$ should be decreased (D), and gate 306 indicates when $f_V$ and $f_R$ are phase locked.

The states, A through G, of the state diagram of FIG. 2 correspond to the Q outputs of each f/f. Although there are only seven states needed to implement the state diagram of FIG. 2, four f/fs are used which could implement 16 states. The phase detector 118 is in state B only when the Q output of f/f 312 is set (Q=1). State E is indicated only when the Q output of f/f 314 is set. State C is indicated only when the Q outputs of both f/f 310 and f/f 312 are set. State F is indicated only when the Q outputs of both f/f 314 and f/f 316 are set. State D is indicated only when the Q output of f/f 310 is set. State G is indicated only when the Q output of f/f 316 is set. State A is a special case, and, generally, will be indicated when all f/fs 310, 312, 314, and 316 are reset.

The following table summarizes the correspondence between the states shown in FIG. 2 and the Q output of each f/f 310, 312, 314 and 316:

| state | f/f 310 | 312 | 314 | 316 |
|-------|---------|-----|-----|-----|
| A | 0 | 0 | 0 | 0 |
| B | 0 | 1 | 0 | 0 |
| C | 1 | 1 | 0 | 0 |
| D | 1 | 0 | 0 | 0 |
| E | 0 | 0 | 1 | 0 |
| F | 0 | 0 | 1 | 1 |
| G | 0 | 0 | 0 | 1 |

The following discussion may be helpful in understanding the setting and resetting of each of the f/fs 310, 312, 314 and 316.

Referring to FIGS. 2 and 3, presuming the phase detector is in state A, when an edge from $f_R$ is received at the clock inputs of f/fs 310 and 312, the Q output of f/f 312 is set to indicate a phase error since $f_R$ is received before $f_V$ (the D inputs of f/fs 312 and 314 are always high), and the phase detector transits from state A to state B.

The Q output of f/f 310 will not be set until an $f_R$ edge is received when its D input is high. This will not occur unless the phase detector 118 is in state B, C or D when the $f_R$ edge is detected. An OR gate 318 receives the Q outputs of f/fs 310 and 312 to provide this function to the D input of f/f 310. Thus, after the second consecutive $f_R$ edge, both Q outputs of f/fs 310 and 312 will be set to indicate a frequency difference since the period of $f_R$ is detected as less than the period of $f_V$, and the phase detector will be in state C.

If a third consecutive $f_R$ edge is detected, no change occurs to the f/fs, and the phase detector 118 remains in state C.

While still in state C, if an $f_V$ edge is received by the phase detector 118 (at the clock inputs of f/fs 314 and 316), f/f 314 is momentarily set and then reset, f/f 312 is reset, and the phase detector 118 transits from state C to state D. The resetting of f/fs 312 and 314 is accomplished by ANDing the Q outputs of f/fs 312 and 314 at a gate 322. The output of gate 322 is coupled to reset both f/fs 312 and 314.

While in state D, if an $f_R$ edge is received, f/f 312 is set, and the phase detector 118 transits from state D to state C.

If an $f_V$ edge is received at the clock inputs of f/fs 314 and 316 while in state D, f/f 314 is set, f/f 310 is reset, and the phase detector 118 transits from state D to state E. The resetting of f/f 310 occurs to avoid transits to undesired and/or unused states.

This is accomplished by connecting the output of gate 324 to the reset (R) input of f/f 310 to ensure that f/f 310 is reset only under the presence of three conditions. Each condition is respectively connected at one of three inputs to gate 324: the inverted Q output from f/f 310, the output of gate 322 and the output of an AND gate 326.

The inverted Q output of f/f 310 is received by gate 324 to ensure that f/f 310 is not reset if the phase detector 118 is not in state C or state D. The output of gate 322 is received by gate 324 to prevent f/f 310 from resetting when f/fs 312 and 314 are being reset. The output of gate 326 is received by gate 324 to prevent f/f 310 from resetting unless f/fs 314 and 316 are reset. This latter function is accomplished by coupling the inverted Q outputs of f/fs 314 and 316 to the inputs of gate 326.

Once the phase detector 118 transits from state D to state E, if the next edge detected is from $f_R$, f/f 314 is momentarily set to indicate a phase error and then reset, and the phase detector 118 returns to state A. If the next edge detected if from $f_V$ rather than $f_R$, f/f 316 is set to indicate a frequency difference since the period of $f_V$ is detected as less than the period of $f_R$, and the phase detector 118 transits from state E to F. The setting of f/f 316 is accomplished via gate 320 which receives the Q outputs of f/fs 314 and 316 as inputs. The function of gate 320 with respect to f/f 316 is analogous to that of gate 318 with respect to f/f 316.

Once the phase detector 118 transits from state E to state F, the phase detector 118 remains in state F if the next edge detected is from $f_V$.

While still in state F, if an $f_R$ edge is received by the phase detector 118, f/f 312 is momentarily set and then reset, f/f 314 is reset and the phase detector 118 transits from state F to state G. The resetting of f/fs 312 and 314 is accomplished as previously described.

While in state G, if an $f_V$ edge is received, f/f 314 is set, and the phase detector 118 transits from state G to state F.

If an $f_R$ edge is detected while in state G, f/f 312 is set, f/f 316 is reset, and the phase detector 118 transits from state G to state B. The resetting of f/f 316 is accomplished similar to the resetting of f/f 310 except with gate 328 instead of gate 324. Gate 324 ensures that f/f 316 is reset only under the presence of three conditions, each of which is provided at one of three inputs to gate 328: the inverted Q output from f/f 316, the output of gate 322 and the output of an AND gate 330. The inverted Q output of f/f 316 is received by gate 324 to ensure that f/f 316 is not reset if the phase detector 118 is not in state F or state G. The output of gate 322 is received by gate 324 to prevent f/f 316 from resetting when f/fs 312 and 314 are being reset. The output of gate 330 is received by gate 328 to prevent f/f 316 from resetting unless f/fs 310 and 312 are reset. This latter function is accomplished by coupling the inverted Q outputs of f/fs 310 and 312 to the inputs of gate 330.

As previously discussed, gates 302, 304 and 306 are employed for indicating when the frequency of $f_V$ should be increased (U), when the frequency of $f_V$ should be decreased (D), and when $f_V$ and $f_R$ are phase locked, respectively.

The indication that the frequency of $f_V$ should be increased, via gate 302, is accomplished by ORing the Q outputs of f/fs 310 and 312 at gate 302. If one or more of the Q outputs of f/fs 310 and 312 is set, then the phase detector is in state B, C or D. Thus, the frequency of $f_V$ should be increased.

The indication that the frequency of $f_v$ should be decreased, via gate 304, is accomplished by ORing the Q outputs of f/fs 314 and 316 at gate 304. If one or more of the Q outputs of f/fs 314 and 316 is set, then the phase detector is in state E, F or G, and the frequency of $f_v$ should be decreased.

The indication that $f_v$ and $f_r$ are phase locked, via gate 306, is accomplished by NORing the Q outputs of f/fs 310 and 316 at gate 306. If neither of the Q outputs of f/fs 310 and 316 is set, then the phase detector is in state A, B or E, and $f_v$ is phase locked to $f_R$.

The outputs (U and D) from gates 302 and 304 of the phase detector 118 are applied to the correction circuit (124 in FIG. 1) to provide an improved synthesizer with optimal phase acquisition performance, while the output (L) from gate 306 is a non-integrated level-type indication which may be applied directly to radio logic circuitry to inform the radio when the synthesizer is phase locked.

It will be understood by those skilled in the art that various modifications and changes may be made to the present invention without departing from the spirit and scope thereof.

What is claimed is:

1. A digital phase detector for indicating the phase error between first and second digital frequency signals, comprising:
    phase detection means, responsive to the first and second digital frequency signals, for detecting a phase error between the first and second frequency signals and for providing corresponding up and down steering signals;
    frequency detection means, responsive to the phase detection means, for detecting a difference in frequency between the first and second digital frequency signals; and
    level-type indicating means, responsive to the frequency detection means, for indicating when the first and second digital frequency signals are phase locked.

2. A digital phase detector, according to claim 1, wherein the frequency detection means includes means for detecting two consecutive edges of the first frequency without an intervening edge from the second frequency signal.

3. A digital phase detector, according to claim 1, wherein the frequency detection means includes first means for detecting two consecutive edges of the first frequency without an intervening edge from the second frequency signal, and second means for detecting two consecutive edges of the second frequency without an intervening edge from the first frequency signal.

4. A digital phase detector, according to claim 1, wherein the frequency detection means is also responsive to the first and second frequency digital signals.

5. A frequency synthesizer, comprising:
    a frequency generator for generating a reference signal having a stable frequency;
    a voltage controlled oscillator (VCO) having an output frequency signal;
    dividing means, responsive to the output frequency signal, for developing a VCO signal having a frequency proportional to the output frequency signal;
    a digital phase detector having:
        phase detection means, responsive to the VCO signal and the reference signal, for determining any phase error between the VCO signal and the reference signal and for providing corresponding up and down steering signals;
        frequency detection means, responsive to the phase detection means, for detecting a difference in frequency between the VCO signal and the reference signal; and
        level-type indicating means, responsive to the frequency detection means, for indicating when the VCO signal and the reference signal are phase locked; and
    correction means, responsive to the up and down steering signals, for controlling the phase and frequency of the output frequency signal of the VCO with respect to the phase and frequency of the reference signal.

6. A frequency synthesizer, according to claim 5, wherein the frequency detection means includes first frequency detection means for detecting two consecutive edges of the VCO signal without an intervening edge from the reference signal, and second frequency detection means for detecting two consecutive edges of the reference signal without an intervening edge from the VCO signal.

7. A frequency synthesizer, according to claim 5, wherein the frequency detection means further includes means for indicating when the frequency of one of the VCO signal and the reference signal is greater than the frequency of the other of the VCO signal and the reference signal and for maintaining that indication until the frequency of said other signal becomes greater than the frequency of said one.

8. A digital phase detector for indicating the phase error between first and second digital frequency signals, comprising:
    phase detection means, responsive to the first and second digital frequency signals, for determining any phase error between the first and second digital frequency signals and for providing corresponding up and down steering signals to indicate the polarity of the phase error;
    first frequency detection means, responsive to the phase detection means and the first and second digital frequency signals, for detecting when the frequency of the first digital frequency signal is greater than the frequency of the second digital frequency signal and for providing a first indication representative thereof;
    second frequency detection means, responsive to the phase detection means and the first and second digital frequency signals, for detecting when the frequency of the first digital frequency signal is less than the frequency of the second digital frequency signal and for providing a second indication representative thereof;
    wherein the first indication does not change until the second frequency detection means detects that the first digital frequency signal is less than the frequency of the second digital frequency signal, and wherein the second indication does not change until the first frequency detection means detects that the first digital frequency signal is greater than the frequency of the second digital frequency signal; and
    level-type indicating means, responsive to the absence of the first and second frequency detection means detecting that the first and second digital frequency signals differ in frequency, for indicating that the first digital frequency signal is phase locked to the second digital frequency signal.

9. A digital phase detector, according to claim 8, wherein the first frequency detection means includes means for detecting two consecutive edges of the first digital frequency signal without an intervening edge from the second digital frequency signal.

10. A digital phase detector, according to claim 8, wherein the second frequency detection means includes means for detecting two consecutive edges of the second digital frequency signal without an intervening edge from the first digital frequency signal.

11. A digital phase detector, according to claim 8, wherein the phase detection means includes two intercoupled flip flops for detecting and indicating the arrival of the respective edges of the first and second digital frequency signals.

12. A digital phase detector, according to claim 11, wherein the frequency detection means includes two intercoupled flip flops, responsive to the two flip flops of the phase detection means, for detecting and indicating the frequency difference between the first and second digital frequency signals.

* * * * *